United States Patent [19]

Hoshino

[11] Patent Number: 4,786,872
[45] Date of Patent: Nov. 22, 1988

[54] NMR IMAGING METHOD AND APPARATUS

[75] Inventor: Kazuya Hoshino, Tokyo, Japan

[73] Assignee: Yokogawa Medical Systems, Limited, Tokyo, Japan

[21] Appl. No.: 65,359

[22] PCT Filed: Oct. 29, 1986

[86] PCT No.: PCT/JP86/00546
§ 371 Date: Jun. 23, 1987
§ 102(e) Date: Jun. 23, 1987

[87] PCT Pub. No.: WO87/02569
PCT Pub. Date: May 7, 1987

[30] Foreign Application Priority Data

Oct. 31, 1985 [JP] Japan ............................. 60-244820

[51] Int. Cl.$^4$ ............................................. G01R 33/20
[52] U.S. Cl. ......................................... 324/309; 324/312
[58] Field of Search ....................... 324/309, 312, 307

[56] References Cited

U.S. PATENT DOCUMENTS

| 4,536,712 | 8/1985 | Iwaoka et al. | 324/307 |
| 4,684,890 | 8/1987 | Briguet et al. | 324/309 |
| 4,694,250 | 9/1987 | Iwaoka et al. | 324/307 |
| 4,694,251 | 9/1987 | Yoshitome et al. | 324/307 |

FOREIGN PATENT DOCUMENTS 2126731 3/1984 United Kingdom ............. 324/309

Primary Examiner—John Chapman
Assistant Examiner—Lawrence G. Fess
Attorney, Agent, or Firm—Moonray Kojima

[57] ABSTRACT

An NMR imaging method and apparatus according to the present invention which enables a reduction in the scanning time without lowering the contrast resolving power and the spatial resolving power is arranged such that data which belongs to a relatively low spatial frequency region is collected by an ordinary scanning method, while data which belongs to a relatively high spatial frequency region is collected by a scanning method which enables data to be collected at a relatively high frequency, and reconstruction of an image is effected on the basis of data synthesized from data collected by these two methods.

8 Claims, 2 Drawing Sheets

NMR IMAGING METHOD AND APPARATUS

DESCRIPTION

1. Technical Field

The present invention relates to improvements in an NMR imaging method and apparatus for obtaining a cross-sectional image of an object of inspection by utilizing nuclear magnetic resonance. More particularly, the present invention pertains to an NMR imaging method and apparatus wherein the scanning time required to collect NMR signals by the Fourier transformation method is reduced.

2. Background Art

An NMR imaging apparatus has a magnet section including a static magnetic field coil for producing a uniform static magnetic field $H_0$ and a gradient magnetic field coil for producing a magnetic field which extends in the same direction as the static magnetic field $H_0$ and which has a linear gradient in each of the x, y and z directions, a transmission and reception section which is arranged to apply radio-frequency pulses (radio-frequency electromagnetic wave) to an object of inspection placed within the magnetic field formed by the magnet section and to detect an NMR signal from the object, a control and image processing section which is arranged to control the operation of the transmission and reception section and that of the magnet section and to process detected data to thereby display an image, and other sections or members.

In such an NMR imaging apparatus, the transmission and reception section is under the control of the control and image processing section so as to output radio-frequency pulses in a sequence in accordance with the saturation recovery (SR) method or the inversion recovery (IR) method and on the basis of the multislice method. The control and image processing section effects collection of data on the basis of the Fourier transformation method in order to reconstruct an image.

In the above-described radio-frequency pulse sequence, the recovery of excited spins depends on a natural relaxation process. Accordingly, the proportion of the data observation time with respect to the scanning time is low and the S/N per time is low. Further, since the spin excitation interval is determined in view of the recovery of spins, the scanning time is correspondingly long, so that the rate of incidence of artifacts due to the movement of the object's body is high. On the other hand, the multislice method enables a plurality of images to be obtained within the same scanning time. However, there is no change in the entire scanning time and, therefore, this method is helpless against artifacts due to the movement of the object's body.

To shorten the scanning time in the SR or IR method, it is necessary to reduce the number of times of phase encoding (spin warp), and this leads to a lowering in the spatial resolving power of the NMR image.

One example of methods which have heretofore been invented in order to solve these problems is the FR (Fast Recovery) method disclosed, for example, in Japanese Patent Laid-Open Nos. 231438/1984 and 29684/1985. The feature of this method resides in that a radio-frequency pulse sequence is applied without awaiting spins to recover to a thermal equilibrium state so as to forcedly direct the magnetization M (the sum total of spins) toward the z-axis direction. More specifically, the sequence according to the FR method is so designed that the scanning speed is given priority and scanning is thereby completed within a short period time. Thus, it is possible to shorten the scanning time itself.

The conventional NMR imaging apparatus suffers, however, from the following problems. Since the recovery of spins to a thermal equilibrium state is forcedly effected, the contrast of an NMR image which originally strongly depends on the relaxation time is deteriorated. More specifically, the prior art has the problem that as the scanning time is reduced (as the speed of scanning is increased), the contrast of the resultant NMR image is degraded.

DISCLOSURE OF THE INVENTION

It is an object of the present invention to provide an NMR imaging method and apparatus which is so designed that the scanning time is reduced without any lowering in the quality of an image, such as the contrast resolving power and the spatial resolving power.

To this end, the present invention provides an NMR imaging method and apparatus wherein data which belongs to a relatively low spatial frequency region is collected by an ordinary scanning method, while data which belongs to a relatively high spatial frequency region is collected by a scanning method which enables data to be collected at a relatively high frequency, and reconstruction of an image is effected on the basis of data synthesized from data collected by these two methods.

BEST MODE FOR CARRYING OUT THE INVENTION

The present invention will be described hereinunder in detail with reference to the drawings.

Figure 1:
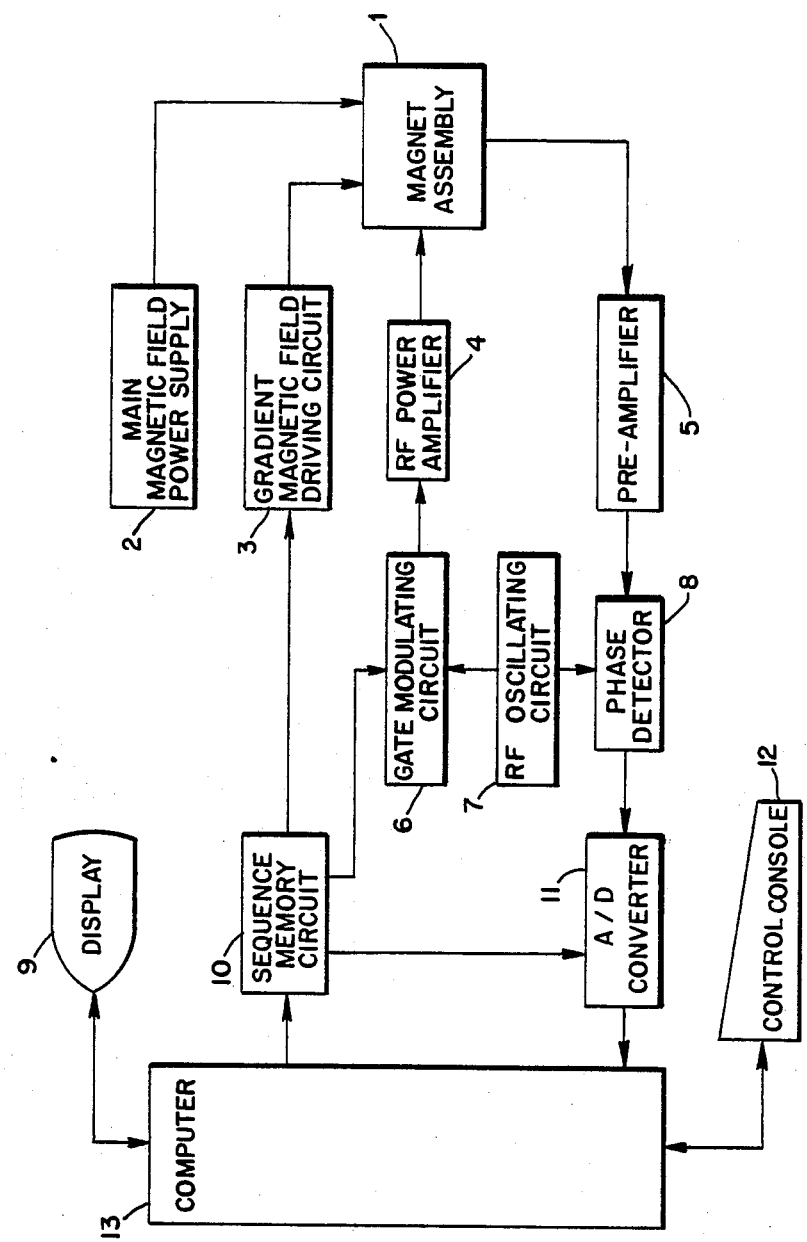
FIG. 1 is a block diagram of one embodiment of the present invention.

FIG. 1 is a block diagram of one embodiment of the present invention. A magnet assembly 1 has a space portion therein for receiving an object of inspection. The following various coils are disposed in such a manner as to surround this space portion: namely, a static magnetic field coil for applying a predetermined static magnetic field to the object; x-, y- and z-gradient magnetic field coils for generating gradient magnetic fields; an RF transmission coil for applying radio-frequency pulses to the object in order to excite nuclear spins within the object; a reception coil for detecting an NMR signal from the object; etc. (not shown). The static magnetic field coil, the gradient magnetic field coil, the RF transmission coil and the reception coil are connected to a main magnetic field power supply 2, a gradient magnetic field driving circuit 3, an RF power amplifier 4 and a pre-amplifier 5, respectively. A sequence memory circuit 10 actuates a gate modulating circuit 6 for each view in accordance with a command from a computer 13 and applies a radio-frequency pulse signal based on the SR or FR method to the RF transmission coil through the RF power amplifier 4 in accordance with each of the sequences stored in advance. The sequence memory circuit 10 further actuates the gradient magnetic field driving circuit 3, the gate modulating circuit 6 and an A/D converter 11 in accordance with a sequence based on the Fourier transformation method. A phase detector 8 uses the output of the RF oscillating circuit 7 as a reference signal to carry out phase detection of an NMR signal which is detected by the reception coil and delivered through the preamplifier 5 and applies the NMR signal to the A/D converter 11. The A/D converter 11 subjects the NMR signal obtained through the phase detector 8 to analog-to-digital conversion and applies the converted NMR signal to the computer 13. The computer 13 exchanges information with a control console 12, switches over the operation of the sequence memory circuit 10 from one to another and also rewrites the memory in the sequence memory circuit 10 in order to realize various scanning sequences, performs calculation for reconstructing the distribution of information concerning the resonance energy into an image by the use of data supplied from the A/D converter 11, and outputs data concerning the reconstructed image to a display 9.

It is also possible to store a sequence according to each of the SR and FR methods in the computer 13 and rewrite the memory in the sequence memory circuit 10 according to need.

The operation of the above-described arrangement will next be explained.

Figure 2:
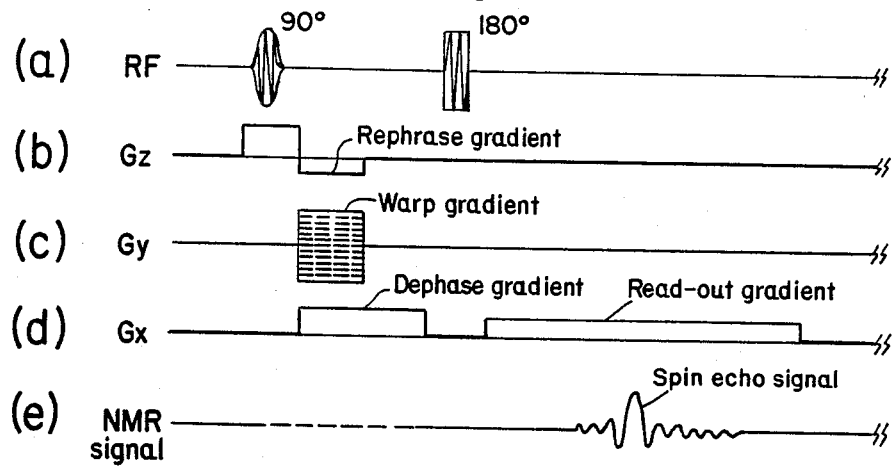
FIGS. 2 to 4 are views employed to describe the operation of the embodiment of the present invention.

Generally speaking, the contrast resolving power gives rise to a problem at a relatively low spatial frequency, that is, a portion having a relatively wide area. Accordingly, the sequence memory circuit 10 actuates, under the control of the computer 13, each circuit and the like with a sequence signal based on the SR method for a view of small amount of warp corresponding to a low spatial frequency, thereby effecting the operation shown in FIG. 2. The operation shown in FIG. 2 is known as the spin warp method, although it will be detailed later. At this time, the contrast at a target imaging position can be increased by selecting predetermined values for scanning parameters.

Figure 3:
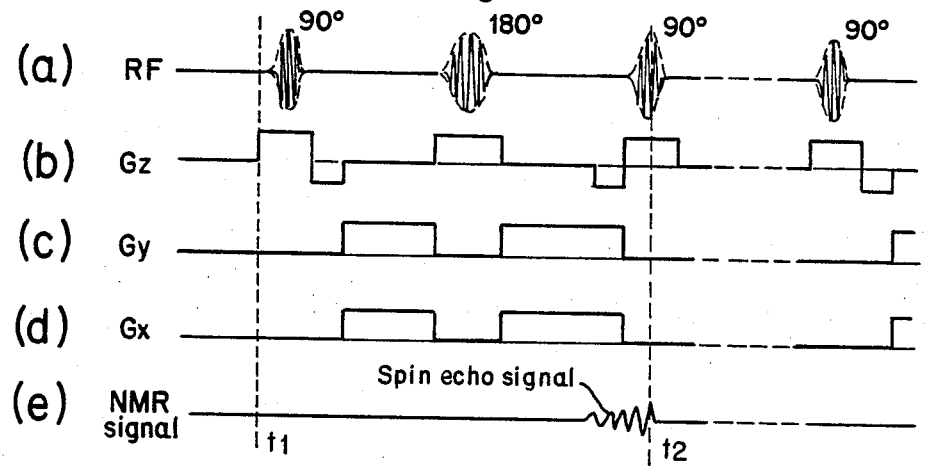

On the other hand, for a view other than the abovedescribed view which has a large amount of warp corresponding to a high spatial frequency, i.e., a portion for which the contrast resolving power gives rise to no serious problem, the sequence memory circuit 10 actuates each circuit and the like with a sequence signal based on the FR method, thereby effecting the operation shown in FIG. 3. The operation shown in FIG. 3 is known a the FR method, althogh it will be detailed later. Thus, collection of data in a view of large amount of warp can be effected within a short period of time.

Figure 4:
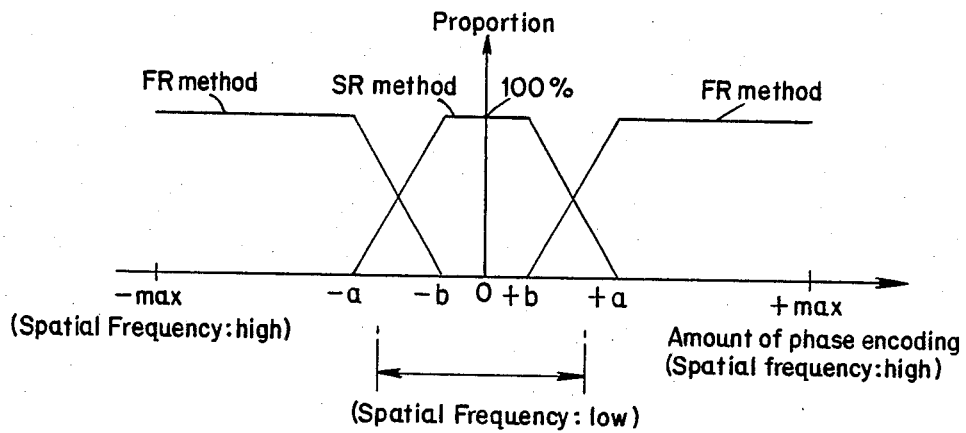

Switching of the SR method and the FR method from one to the other which is effected on the basis of the amount of warp is carried out under the control of the computer 13 with some overlapping portions provided. Accordingly, there is no fear of collection of data being made discontinuous by switching of the two methods. Data collected by each of the sequence signals is weighted in accordance with the spatial frequency region as shown in FIG. 4, that is, subjected to filtering in accordance with the spatial frequency, and then synthesized. With the synthesized data, reconstruction of an image is carried out by the same method as in the prior art. It should be noted that the amount of phase encoding in FIG. 4 means the amount of warp which corresponds to the spatial frequency of data to be collected.

Thus, it is possible to reconstruct an image without lowering the image contrast resolving power, the spatial resolving power and the like by selecting a radio-frequency pulse generating sequence in accordance with spatial frequency characteristics in scanning data. Since a portion of high spatial frequency is subjected to data collection by the FR method with which scanning is effected at high speed, even if the SR method takes somewhat long scanning time, it is possible to realize a reduction in the overall scanning time. If the speed of the FR method is assumed to be, for example, 10 times that of the SR method, the degree to which the speed of the above-described operation is increased is as follows. When 2/10 of the whole views including the overlapping portions is scanned by the SR method and 9/10 is scanned by the FR method, the overall scanning time is reduced to 29% of that in the case of scanning the whole views by the SR method as given by the following equation:

$$2/10 + 9/10 \times 1/10 = 29/100 = 29\%$$

The operations shown in FIGS. 2 and 3 will next be explained in detail.

The sequence shown in FIG. 2 . . . . Under a uniform static magnetic field $H_0$ produced by the main magnetic field power supply 2, the sequence memory circuit 10 actuates the gradient magnetic field driving circuit 3 and the gate modulating circuit 6 so as to generate each of the gradient magnetic fields and radio frequency pulses. The sequence memory circuit 10 further actuates the A/D converter 11 so as to convert an NMR signal detected by the phase detector 8 into a digital signal and inputs it to the computer 13. More specifically, the sequence memory circuit 10 applies a 90° pulse (see FIG. 2(a)) while applying a slice gradient $G_z$ (see FIG. 2(b)). In consequence, spins within a specific slice plane of an object of inspection alone are selectively excited. Then, the following gradients are applied: namely a rephase gradient $G_z$ (see FIG. 2(b)) for recovering the phase shift of spins caused at the time of slicing; a dephase gradient $G_x$ (see FIG. 2(d)) for generating an echo signal later; and a warp gradient $G_y$ (see FIG. 2(c)). Thereafter, the application of all the gradients is cut off, and a 180° pulse is then applied. In consequnce, the spins are inverted, and a spin echo signal is then obtained (see FIG. 2(e)) by the subsequent application of a read-out gradient $G_x$ (see FIG. 2(d)). This echo signal corresponds to one of the lines obtained by subjecting to the two-dimensional Fourier transformation the distribution of intensities of signals from the spins in the object. The selection of lines is effected by means of the product of the amount of application of the y-gradient, i.e., the magnitude of the y-gradient magnetic field $g_y$, and the application time $T_w$. Thereafter, the above-described sequence is repeated with the gradient $G_y$ varied, thus data required to reconstruct an image being collected.

The sequence shown in FIG. 3 . . . . The operation of each circuit during the period which begins at the time $t_1$ and which ends at the time $t_2$ is basically the same as that shown in FIG. 2. A 90° pulse is further applied at the time $t_2$ at which the spin echo signal reaches a maximum. In consequence, the magnetization M (the sum total of spins) is forcedly directed toward the z-axis direction without awaiting the spins to recover to a thermal equilibrium state, and the magnetization M coincides with the z-axis when the time $t_d$ (sufficiently shorter than the longitudinal relaxation time $T_1$) has elapsed after $t_2$. Thus, the first sequence is completed and a similar sequence is repeated thereafter successively with the amount of warp varied. The application of a 90° pulse at the time $t_2$ as described above enables a reduction in the data collecting time per view and hence a reduction in the overall scanning time.

It should be noted that the present invention is not necessarily limited to the above-described embodiment. For example, the IR and FR methods may be combined together. It is also possible to employ a sequence based on the SR method and arrange the scanning parameters, e.g., the repetition time, so as to vary with views. More specifically, the arrangement may be such that, for a portion of large amount of phase encoding which contributes less to the contrast resolving power and S/N, the repetition time TR is shortened to increase the scanning speed, whereas, for a portion of small amount of phase encoding, the repetition time TR is returned to the previous value.

Although the present invention has been described above by way of the best mode for carrying out it, it will be easy for those who have ordinary knowledge of the technical field to which the present invention belongs to make various modifications without departing from the scope of the following claims.

I claim:

1. In an NMR imaging method wherein a static magnetic field, gradient magnetic fields in x-, y- and z- directions and a radio-frequency electromagnetic wave are applied to an object of inspection, an NMR signal from the object is measured by the Fourier transformation method with the amount of warp of spins varied for each view, and a cross-sectional image of the object is reconstructed on the basis of the NMR signal, the improvement which comprises
    measuring the NMR signal with the SR or IR method for low spatial frequency;
    measuring the NMR signal with the FR method so as to be shorter in time than the SR or IR method for high spatial frequency; and
    reconstructing a cross-sectional view of the object on the basis of the data synthesized from the data obtained by these measurements.

2. An NMR imaging method according to claim 1, wherein the frequency range of measurement of the NMR signal with the SR or IR method for low spatial frequency and the frequency range of measurement of the NMR signal with said FR method for high spatial frequency overlap each other at a predetermined range of spatial frequencies.

3. An NMR imaging method according to claim 2, wherein, with respect to data obtained by the SR or IR method and data obtained by the FR method, portion of these data which overlap each other are weighted for the same spin warp amounts.

4. An NMR imaging method according to claim 1, wherein the measurement of the NMR signal is based on the SR method.

5. An NMR imaging method according to claim 1, wherein the measurement of the NMR signal is based on the IR method.

6. In an NMR imaging apparatus having means (1) and (2) for applying a static magnetic field to an object of inspection, means (1) and (3) for applying gradient magnetic fields in x-, y- and z- directions on the basis of the Fourier transformation method to the object, means (1), (4), (6) and (7) for applying a radio-frequency electromagnetic wave to the object; means (1), (5), (8) and (11) for measuring an NMR signal from the object, and means (13) for reconstructing a cross-sectional image of the object on the basis of the measured NMR signal,
    the improvement which comprises:
    means (10) for measuring the NMR signal with the SR or IR method for low spatial frequency;
    means (10) for measuring the NMR signal with the FR method so as to be shorter in time than the SR or IR method for high spatial frequency; and
    means (13) for synthesizing the data obtained by these measuring means and reconstructing a cross-sectional view of the object on the basis of the synthesized data.

7. An NMR imaging apparatus according to claim 6, wherein said means for measuring the NMR signal comprises measuring means based on the SR method.

8. An NMR imaging apparatus according to claim 6, wherein said means for measuring the NMR signal comprises measuring means based on the IR method.

* * * * *